United States Patent [19]

Fukuda

[11] Patent Number: 4,892,752

[45] Date of Patent: Jan. 9, 1990

[54] METHOD OF ION IMPLANTATION

[75] Inventor: Hisashi Fukuda, Tokyo, Japan

[73] Assignee: Oki Electric Industry Co., Ltd., Tokyo, Japan

[21] Appl. No.: 227,255

[22] Filed: Aug. 2, 1988

[30] Foreign Application Priority Data

| Aug. 12, 1987 [JP] | Japan | 62-200001 |
| Aug. 12, 1987 [JP] | Japan | 62-200002 |
| Aug. 19, 1987 [JP] | Japan | 62-204254 |
| Aug. 31, 1987 [JP] | Japan | 62-215453 |

[51] Int. Cl.⁴ .................................... B05D 3/06
[52] U.S. Cl. .................................................. 427/38
[58] Field of Search .......................................... 427/38

Primary Examiner—Bernard Pianalto
Attorney, Agent, or Firm—Wenderoth, Lind & Ponack

[57] ABSTRACT

In an apparatus for and a method of ion implantation for implanting boron (B) and/or arsenic (As) ions in a substrate surface, a four-element alloy of platinum, silicon, arsenic, and boron or a three-element alloy of copper (Cu), arsenic, and boron is held in a reservoir in a molten state; the alloy is then supplied from the reservoir to an emitter, and a strong electric field is applied to the tip of the emitter to extract ions from the tip of the emitter. The reservoir and emitter may be a refractory metal selected from W, Mo, and Ta, at least the surface of which has been nitrided.

4 Claims, 7 Drawing Sheets

(a) BEFORE HYDROGEN DISCHARGE (b) AFTER HYDROGEN DISCHARGE

METHOD OF ION IMPLANTATION

BACKGROUND OF THE INVENTION

This invention relates to a method of and apparatus for ion implantation using a focused ion beam (FIB) for the fabrication of semiconductor devices.

This invention also relates to a liquid metal ion source (LMIS) for generating ions for microbeam ion implantation which is particularly suitable for semiconductor device fabrication.

In the conventional ion implantation technology used for fabrication of semiconductor devices, a broad ion beam ranging from several millimeters to several tens of centimeters in diameter is directed onto a substrate that is masked by a resist pattern.

Recently there has been progress in LMIS technology, in which a strong electric field extracts ions directly from a liquid metal surface. This technology offers the alternative of maskless microfabrication techniques such as milling, etching, resist exposure, ion implantation, and deposition to be performed in regions on the order of 0.1 micrometers in size without using a mask.

In applications to the fabrication of silicon-based large-scale integrated circuits, however, it is essential that the LMIS material include: (i) a dopant element (such as B, As, or P); (ii) a metallic element (such as Pt, Ni, or Pd) for electrode formation; and (iii) an element needed for observation of a scanning ion microscope (SIM) image of the region to be implanted, preferably an element (such as Si) that will not affect the device characteristics. Among the elements mentioned above, As and P have high vapor pressures and vaporize easily, while B and Pt have high melting points, yielding a small ion current density, so it is not possible to use these elements alone as the LMIS material. The necessary elements are therefore combined into a eutectic alloy in which the above faults are removed. LMIS alloys such as Au-Si, Au-Si-Be, Pd-Ni, Si-Be-B, Pt-As, Pd-As-B, Ni-B-Si, Pd-As, B-P, and Cu-P have been reported in the literature *Journal of Vacuum Science and Technology B*, Vol. 5, No. 2, 1987, p. 469. The materials used as an LMIS alloy are required to be easily wetted by but not to undergo chemical reactions with the emitter needles in a molten state.

Even when a eutectic alloy of elements such as Pd, Ni, B, As, Si and P is used as the LMIS material, however, it has not been possible to obtain a sufficient ion current because B and As are insufficiently fused in the alloy, causing As to be preferentially vaporized and B to be segregated. A further problem is that B, Ni and Pd undergo strong chemical reactions with emitter materials such as W, Ta, and Mo, so it is not possible to obtain an ion current that is stable for long periods of time.

Another problem is contamination of the LMIS by sputtered atoms or residual gas during ion source operation that has been found to reduce the ion current. Particularly, carbon adheres to the emitter surface during LMIS operation in an FIB apparatus and causes ion current to decrease by obstructing the flow of alloy on the emitter surface.

SUMMARY OF THE INVENTION

An object of the present invention is to provide an apparatus for and a method of ion implantation in which the elements needed for silicon devices are included, the ion current density is sufficiently high, and the ion source does not become degraded.

Another object of the present invention is to provide an apparatus for and a method of FIB ion implantation in which a stable FIB ion current can be obtained.

Another object of the present invention is to provide an LMIS that enables the emitter to be fabricated with comparative ease, that can suppress reactions between the molten metal and emitter during LMIS operation, and that can provide a stable ion current.

According to one aspect of the invention, when B and/or As ions are implanted in a substrate, a Pt-Si-As-B alloy with an atomic composition of at least 10% As and 10% B is held in a molten state in a reservoir. This alloy is supplied from the reservoir to the emitter, and a strong electric field is applied to the tip of the emitter to extract ions from the emitter tip. A W-Re (rhenium) alloy is used as the emitter material to suppress chemical reactions with the alloy.

With the above configuration, since the four-element alloy Pt-Si-As-B is used as the LMIS material for the FIB, continuous implantation of B and As ions is possible. Implantation of Pt ions further enables electrode formation in the necessary regions. Emission of Si ions is also possible, so SIM observations can be carried out without affecting device properties. In addition, since a W-Re alloy is used as the emitter material, reactions with the Pt-Si-As-B alloy can be suppressed and a stable ion current can be obtained over a long period of time.

According to another aspect of the invention, when B and/or As ions are implanted in a substrate, a Cu-As-B alloy with an atomic composition of at least 10% As and 10% B is held in a molten state in a reservoir, this alloy is supplied from the reservoir to the emitter, and a strong electric field is applied to the tip of the emitter to extract ions from the tip of the emitter.

Use of an emitter material, preferably Ni, that is readily wetted by Cu-As-B enables a stable B or As ion current to be obtained.

With the above configuration, since a three-element Cu-As-B alloy with good eutectic properties is used as the LMIS material for the FIB, continuous, selective implantation with a high ion current density of B ions and As ions is possible. B ions become acceptors with respect to Si. As ions become donors.

In addition, use of Ni as the emitter material can improve wetting properties with respect to the Cu-As-B alloy and suppress reactions, enabling a stable ion current to be obtained over a long period of time.

According to another aspect of the invention, the LMIS section in an FIB apparatus is provided with a discharging device and a gas supply arrangement and a gas venting device is also provided. The LMIS is cleaned by introducing $H_2$ and/or Ar gas into the LMIS section of the FIB apparatus and venting the gas while applying a high voltage between the emitter and extraction electrode, thereby discharging the LMIS section. This surface treatment is carried out before or after the LMIS operation.

With the above configuration, the gas supply arrangement provided in the ion source section of the FIB apparatus supplies $H_2$ and/or Ar gas to the LMIS section, a gas venting device is provided for venting the gas, and the LMIS section is discharged by a discharging device provided in the LMIS section, so adherent carbon on the emitter surface is converted to hydrocarbons ($C_mH_n$, m and n integers) which evaporate from the emitter surface. Thus the flow of alloy on the emitter surface can be improved, and a stable ion current can be obtained.

According to another aspect of the invention, in a LMIS having a reservoir for storing a material to be ionized, an emitter for emitting from its tip ions of the material to be ionized supplied from the reservoir, and an extraction electrode for applying an electric field between itself and the emitter and extracting ions from the emitter tip, the reservoir and emitter comprise a refractory metal at least the surface of which has been nitrided, obtained by high-temperature heat treatment of a refractory metal selected from W, Mo, and Ta in an atmosphere including nitrogen gas.

With the above arrangement, the reservoir and emitter comprise a refractory metal at least the surface of which has been nitrided, so the wetting properties of the liquid metal and emitter are preserved, reactions with the liquid metal are suppressed, and a stable ion current can be obtained over an extended period of time.

DETAILED DESCRIPTION OF THE PREFERRED EMBODIMENTS

Figure 1:
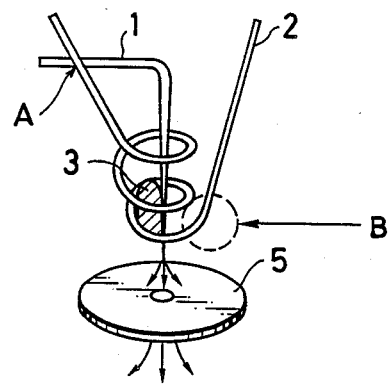
FIG. 1 is a schematic representation of an ion source in an FIB system.

FIG. 1 is a schematic representation of an ion source in an FIB apparatus, comprising an emitter 1, a heater 2, and an LMIS material 3. The emitter tip 1 and the heater 2 are both fabricated from 0.2 mm-diameter alloy wire having an atomic composition of 75% W and 25% Re (rhenium), and are spot-welded together at the point A. The tip of the emitter 1 protrudes 0.5 mm beyond the heater, the space between the tip of the emitter 1 and the heater 2 being approximately 2 mm. In this embodiment a eutectic Pt-Si-As-B alloy [Pt:Si:As:B=4:4:1:1 (percent atomic composition)] was used as the LMIS material 3. The Pt-Si-As-B alloy was fabricated by the following procedure. First, the constituent elements were weighed and vacuum-sealed in a quartz tube. Next the tube was heated to 1000° C. and the elements were mixed. Then they were oven-annealed at 800° to 1000° C. for 30 to 50 hours to obtain a uniform composition. Application of this LMIS material to the heater 2, which heats it to a temperature of 800° C., and application of a high electric field of 1V/Å to the tip of the emitter 1 extracts B ions, which become acceptors with respect to the Si substrate, and As ions, which become donors. The B ions and As ions are implanted selectively by means of a commonly-employed type of mass separator, such as a Wien filter, which is not shown in the drawings.

Figure 2:
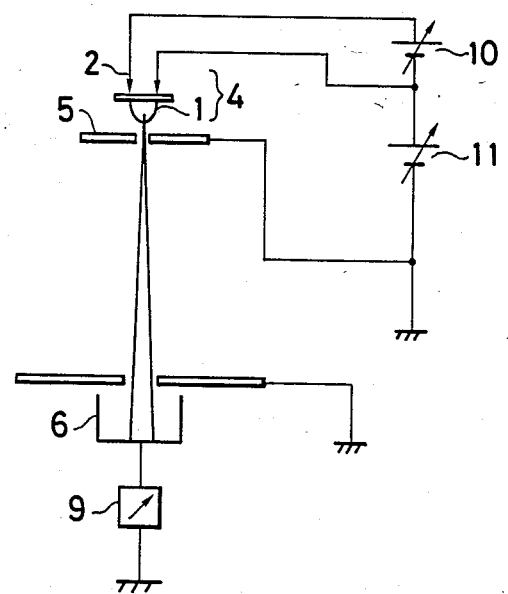
FIG. 2 illustrates an arrangement of electrodes for measuring emitted ion current.

FIG. 2 illustrates an arrangement of electrodes for measuring the emitted ion current. Reference numeral 4 denotes the ion source including the emitter 1, the heater 2 and the LMIS material 3 (not shown in FIG. 2). 5 is an extraction electrode, and 6 is a Faraday cup. Reference numeral 9 is a current meter, 10 is a power supply for heating the heater, and 11 is a power supply for accelerating the ions. The electrodes are arranged to measure the ion current emitted within an angle of 1 degree. This apparatus was used to measure the ion current at the Faraday cup in relation to the extraction voltage applied to the extraction electrode 5 when a eutectic Pt-Si-As-B alloy was used as the LMIS material.

Figure 3A:
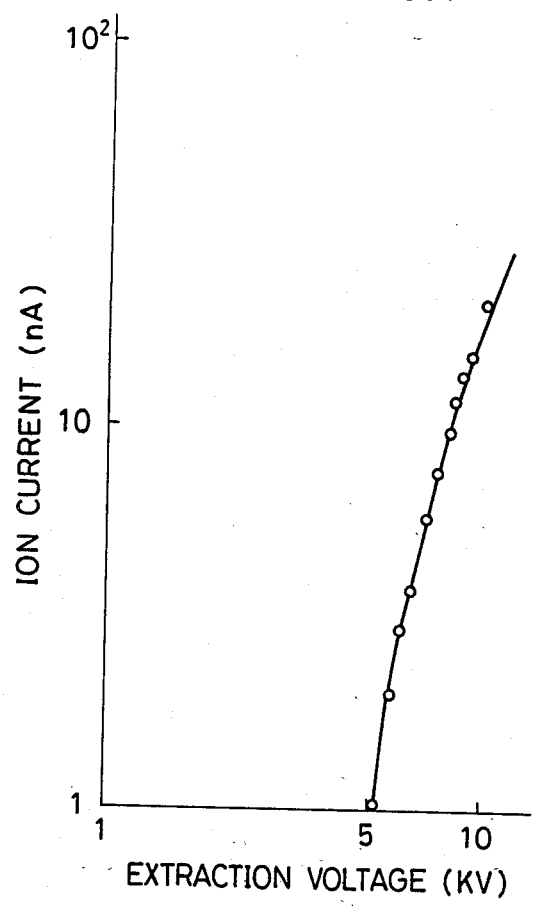
FIG. 3A is a graph showing an extraction-voltage/emitted-ion-current characteristic.

FIG. 3A shows the observed extraction-voltage/ion-current-emission characteristic, with voltage on the horizontal axis and ion current on the vertical axis. As a result of the use of an emitter material with an atomic composition of 95% W and 5% Re with this Pt-Si-As-B material, in two hours of operation a reaction with the alloy caused the heater wire to break at the point B indicated in FIG. 1. When the percent atomic composition of Re was 10% or higher, degradation of the ion source due to breaking of the wire did not occur.

According to the foregoing embodiment of this invention, when ion implantation is performed using a focused ion beam, since a eutectic Pt-Si-As-B alloy is supplied as the LMIS material in the FIB apparatus and a W-Re alloy is used as the emitter material, the ion implantation can be carried out over a long period of time with a high ion current density. In addition, continuous implantation is possible of B ions, which become acceptors with respect to the Si substrate, and As ions, which become donors. Moreover, Pt ions can be implanted to form electrodes in required regions. It is also possible to emit Si ions for SIM observations without affecting the device characteristics.

In this embodiment as described above, use of a eutectic Pt-Si-As-B alloy as the FIB LMIS material enables selective implantation of Pt ions, Si ions, As ions, and B ions in microscopic regions with a high ion current density. Use of a W-Re alloy for the emitter material prevents degradation of the emitter and enables ion implantation to be carried out for extended times.

A second embodiment of this invention is similar to the first embodiment described above. But, the emitter tip 1 and the heater 2 are both fabricated from 0.3 mm-diameter nickel (Ni) wire. A eutectic Cu-As-B alloy [Cu:As:B=2:1:1 (percent atomic composition)] was used as the LMIS material 3.

The Cu-As-B alloy was fabricated by the following procedure. First, the constituent elements were weighed and vacuum-sealed in a quartz tube. Next the tube was heated to 1000° C. and the elements were mixed. Then they were oven-annealed at 800° to 1000° C. for 30 to 50 hours to obtain a uniform composition. The emitter was electrolytically polished in a 35% HCl solution at 4V for 30 minutes to reduce the tip diameter to approximately 1 micrometer. The operating vacuum pressure was normally $1 \times 10^{-6}$ Torr.

After this LMIS material is mounted on the heater 2, it is raised by the heater to a temperature of 800° C. and melted, and application of a high electric field of 1V/Å to the tip of the emitter 1 extracts B ions, which become acceptors with respect to the Si substrate, and As ions, which become donors. The B ions and As ions are implanted selectively by means of a commonly-employed type of mass separator, such as a Wien filter, which is not shown in the drawings.

The arrangement for measuring the emitted ion current described with reference to FIG. 2 can also be used in this second embodiment.

Figure 3B:
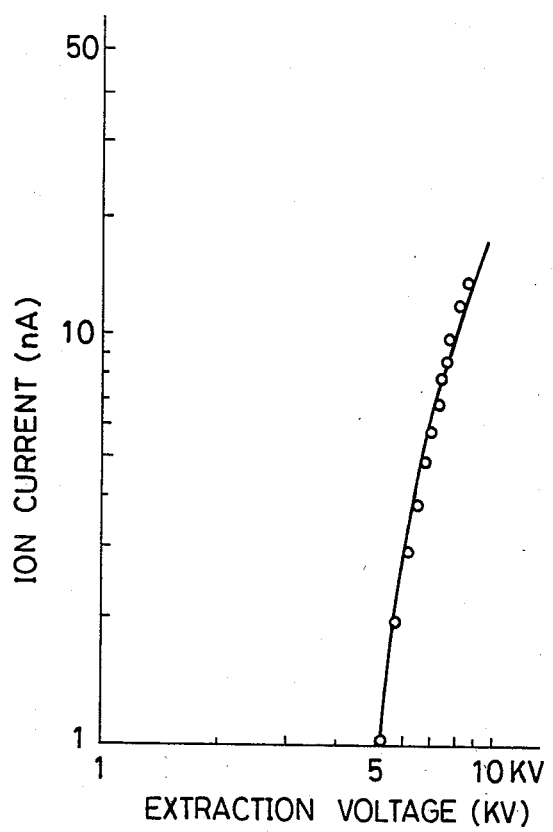
FIG. 3B is a graph showing a Cu-As-B ion emission characteristic.

FIG. 3B shows the observed extraction-voltage/ion-current-emission characteristic, and indicates that a high ion current density was obtained.

Use of a conventional tungsten (W) emitter material with this Cu-As-B LMIS material resulted in poor wetting properties due to the high surface tension of the alloy. By using nickel (Ni) as the emitter material, however, it was possible to improve the wetting properties with respect to the Cu-As-B alloy and suppress reactions with the LMIS material.

In this embodiment as described above, use of a three-element Cu-As-B alloy as the FIB LMIS material enables selective implantation of B, which is a p-type material with respect to Si, and As, which is an n-type material, in microscopic regions with high ion current density.

Use of Ni for the emitter material can improve wetting by the Cu-As-B alloy and suppress reactions, enabling operation for extended times.

Figure 4:
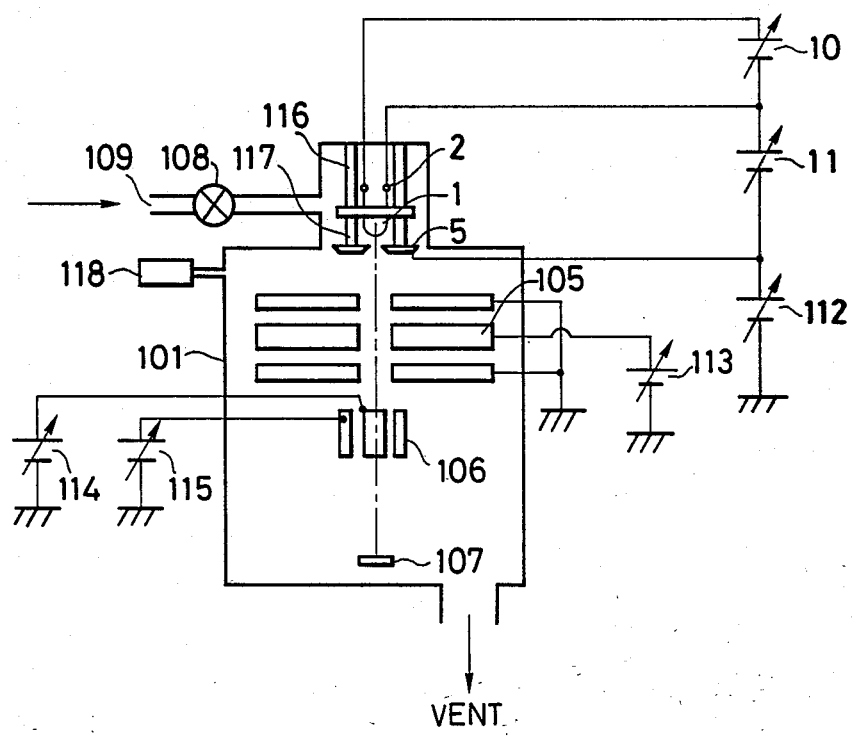
FIG. 4 is a schematic drawing of an FIB apparatus illustrating an embodiment of this invention.

A third embodiment of this invention will be described with reference to the explanatory drawings in FIGS. 4 to 6. FIG. 4 is a schematic drawing of an FIB apparatus. The reference numerals identical to those in FIGS. 1 to 3 denote identical or similar members or parts. 101 denotes an enclosing chamber, 105 is a lens system, 106 is a deflection electrode, 107 is a specimen, 108 is a valve, 109 is a gas tube for supplying gas to the LMIS section comprising the emitter 1, the heater 2, and the extraction electrode 5, 112 is an ion acceleration power supply, 113 is a lens power supply, 114 and 115 are beam deflection power supplies, 116 and 117 are isolation terminals, and 118 is a vacuum gauge.

Carbon adhering to the surface of the emitter 1 during FIB ion implantation is removed in the following manner. The chamber 101 is evacuated to a pressure of approximately $1 \times 10^{-6}$ Torr, then the valve 108 is opened and hydrogen gas (H$_2$) is introduced through the gas tube 109.

H$_2$ gas is introduced until the chamber 101 reaches a vacuum pressure of approximately $1 \times 10^{-3}$ Torr. Then the ion extraction power supply 11 is used to apply a DC voltage of 5 to 10 kV between the emitter 1 and the extraction electrode 5. In this state a discharge occurs between the emitter 1 and the extraction electrode 5, causing an ion current flow on the order of 1 to 10 mA. As a result, carbon adhering to the surface of the emitter 1 is converted to hydrocarbons ($C_mH_n$, m and n integers) which evaporate from the emitter surface, thus cleaning the surface. This surface treatment is normally performed before or after the LMIS is used.

Figure 5:
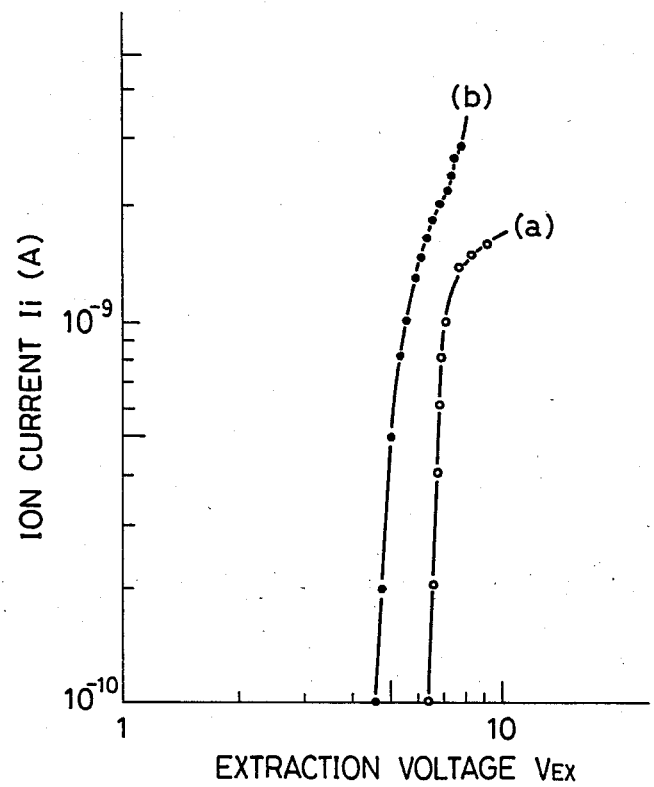
FIG. 5 illustrates an extraction-voltage/ion-current-emission characteristic of an LMIS.

FIG. 5 shows an extraction voltage ($V_{EX}$) vs. ion current ($I_i$) characteristic of an LMIS using a eutectic Pd-Ni-As-B alloy (Pd:Ni:As:B=3:3:2:2). The extraction voltage $V_{EX}$ was controlled by the ion extraction voltage power supply 11 and the ion current $I_i$ was measured at the position of the specimen 107. In FIG. 5, (a) is the emission characteristic after 20 hours of ion source operation, in which state the surface of the emitter 1 is contaminated by carbon, while (b) is the emission characteristic of the ion source after 10 minutes of hydrogen discharge performed in the state of (a). It can be seen that for a given extraction voltage $V_{EX}$, the ion current $I_i$ is greater in (b) than in (a). FIG. 6 shows the results of an Auger spectrum analysis of the composition of the tip of the emitter 1, in which (a) shows the composition after 20 hours of ion source operation before hydrogen discharge, and (b) shows the composition after 20 hours of ion source operation followed by 10 minutes of hydrogen discharge.

Figure 6:
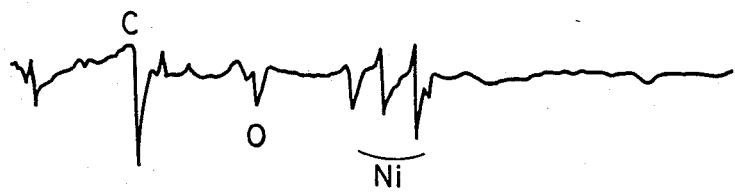
FIG. 6 shows a compositional analysis of the LMIS emitter tip.
Figure 6:
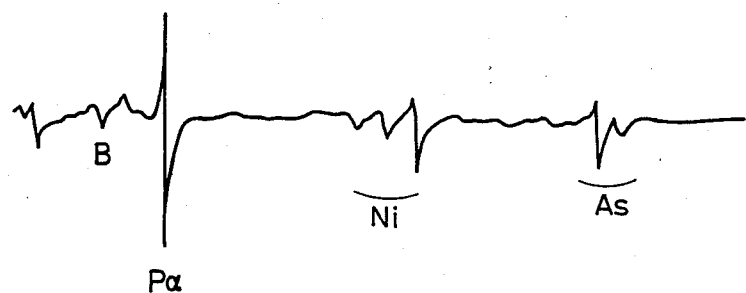

It can be seen from FIG. 6 that after the hydrogen discharge, the carbon adhering to the emitter surface has been removed. The hydrogen discharge treatment thus removes contamination that obstructs the flow of liquid metal on the surface of the emitter 1, so that a clean LMIS surface is exposed again.

Results similar to those shown in FIGS. 5 and 6 are also obtained if, instead of hydrogen gas, Ar gas is introduced through the gas tube 109 and the surface contamination is removed through physical sputtering by discharging the LMIS section.

As explained above, hydrogen discharge performed by means of an apparatus according to the above embodiment converts carbon on the emitter surface to carbon-containing compounds ($C_mH_n$, m and n $\geq$ 1) which evaporate, cleaning the LMIS to enable a stable flow of the alloy to be ionized, and providing a superior ion emission characteristic.

Similar effects can be obtained by removing the carbon by sputtering, by means of a discharge using Ar gas.

Figure 7:
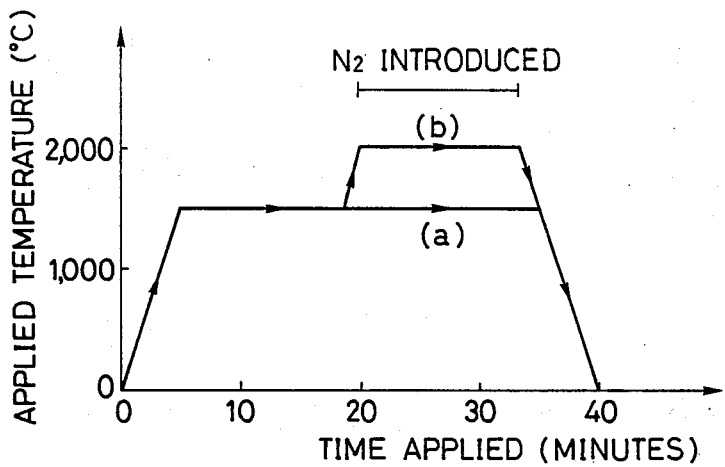
FIG. 7 illustrates methods of heat-treating an LMIS.
Figure 8:
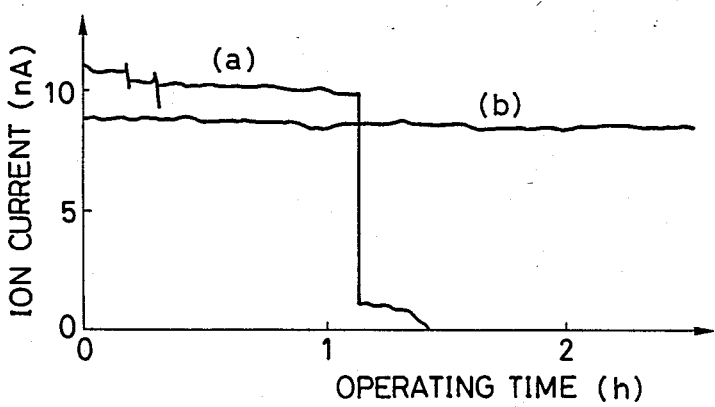
FIG. 8 shows ion current emission characteristics.

Another embodiment of this invention will be described with reference to the explanatory drawings in FIG. 7 and FIG. 8 as well as FIG. 1 and FIG. 2.

This embodiment is directed to an LMIS that enables the emitter to be fabricated with comparative ease, that can suppress reactions between the molten metal and emitter during LMIS operation, and that can provide a stable ion current. Reactions between the liquid metal and the emitter, or between the liquid metal and the heater (the liquid metal reservoir) occur with particular frequency, causing wire breaks at a location as indicated by B in FIG. 1, which have made it impossible to obtain a long-life LMIS that provides a stable ion current. Attempts have been made to reduce the reactivity of the emitter with the molten metal by employing a boride substance such as BN-TiB$_2$, ZrB$_2$, or CrB$_2$ or a carbide substance such as TiC or TaC as the emitter material, but even when these substances are used for the emitter, it is only possible to form the emitter into a needle-tip shape by means of mechanical grinding and polishing, so it has not been easy to machine the emitter tip to a diameter of 1 micrometer or less.

The ion source of an FIB (Focused Ion Beam) apparatus of this embodiment is generally identical to that shown in and described with reference to FIG. 1. Tungsten (W) wire with a diameter of 0.3 mm and a nitrided surface is used for both the heater 2 and the emitter tip 1. The gap between the end of the emitter tip 1 and the extraction electrode 5 is approximately 1 mm. The emitter tip 1 was electrolytically polished in a KOH:H$_2$O:N-H$_4$OH=4:5:1 solution at A.C. 4V for 30 minutes to obtain a tip diameter of approximately 1 micrometer.

Next, to create the LMIS it is placed in vacuum chamber at $1 \times 10^{-7}$ Torr. FIG. 7 shows the manner of heat treatment of the LMIS before the liquid metal is installed. The curve (a) in FIG. 7 shows a method of heat treatment, in which, to remove water, oil, and other contaminants adhering to the W heater 2 and emitter tip 1, LMIS is heat-treated at 1500° C. for approximately 30 minutes. This method exposes a clean W surface at the end of the emitter tip 1. In this method, however, if a liquid alloy including a metal that tends to react with W is installed when the alloy is molten, a reaction occurs with the W, which tends to cause the wire to break in the region marked B in FIG. 1, for example. The curve (b) in FIG. 7 is an improvement of the method of the curve (a) in FIG. 7. In this method of heat treatment, the LMIS is heated to 1500° C. for the first approximately 15 minutes, then after the LMIS has been cleaned, $N_2$ is introduced to a vacuum pressure of $1\times10^{-4}$ Torr, the temperature is raised, and the heat treatment is continued at 2000° C. for approximately 15 minutes. In this way the W surface of the heater 2 and the emitter tip 1 of the LMIS in FIG. 1 are nitrided to form, for example, a thin film of $W_2N$ alloy which possesses an extremely low reactivity with metal.

The arrangement for measuring the emitted ion current described with reference to FIG. 2 can also be used in this embodiment.

A measurement was made when a Pd-Ni-As-B alloy [Pd:Ni:As:B=4:4:1:1 (percent atomic composition] was used as the LMIS material. FIG. 8 shows the observed extraction-voltage/ion-current-emission characteristic. The curve (a) in FIG. 8 shows the characteristic of an LMIS that had been treated by the method indicated by the curve (a) in FIG. 7. The curve (b) in FIG. 8 is the ion current emission characteristic of an LMIS with a nitrided W surface. With the method of the curve (a) in FIG. 7, the LMIS material and the W react chemically and the ion current drops in approximately one hour, but the LMIS with the nitrided W emitter gave a stable ion current in a test run lasting two hours.

Furthermore, since W is used as the emitter material in the embodiment of this invention, electrolytic polishing is able to reduce the tip diameter of the emitter to approximately 1 micrometer by an easy machining process.

Although W was used as the refractory metal for the heater 2 and the emitter tip 1 in the embodiment described above, other refractory metals such as Mo and Ta that do not melt under heat treatment at 2000° C. can also be used.

As described in detail above, use of a refractory metal such as W, Mo, or Ta with a nitrided surface as the emitter eliminates reactivity with the liquid metal and provides an LMIS with an extremely long life. This method can also maintain wetting properties with respect to the liquid metal, enabling a stable ion current to be obtained.

What is claimed is:

1. A method of ion implantation for implanting at least one of boron ions and arsenic ions in a substrate surface, said method comprising:
   providing a four-element alloy of platinum, silicon, arsenic, and boron, a reservoir, and an emitter having a tip;
   holding said four-element alloy in said reservoir in a molten state;
   supplying said four-element alloy from said reservoir to said emitter;
   applying a strong electric field to said tip of said emitter to extract ions from said tip of said emitter; and
   implanting the extracted ions in the substrate surface.

2. The method of ion implantation as set forth in claim 1, wherein:
   said step of providing said emitter comprises providing an emitter comprising an alloy of rhenium and tungsten.

3. A method of ion implantation for implanting at least one of boron ions and arsenic ions in a substrate surface, said method comprising:
   providing a three-element alloy of copper, arsenic and boron, a reservoir, and an emitter having a tip;
   holding said three-element alloy in said reservoir in a molten state;
   supplying said three-element alloy from said reservoir to said emitter;
   applying a strong electric field to said tip of said emitter to extract ions from said tip of said emitter; and
   implanting the extracted ions in the substrate surface.

4. The method of implantation as set forth in claim 3, wherein:
   said step of providing said reservoir and said emitter comprises providing a reservoir and an emitter made of nickel.

* * * * *